United States Patent
Smorenburg

(10) Patent No.: US 12,196,688 B2
(45) Date of Patent: Jan. 14, 2025

(54) METHOD AND APPARATUS FOR EFFICIENT HIGH HARMONIC GENERATION

(71) Applicant: ASML Netherlands B.V., Veldhoven (NL)

(72) Inventor: Petrus Wilhelmus Smorenburg, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 181 days.

(21) Appl. No.: 17/772,826

(22) PCT Filed: Oct. 15, 2020

(86) PCT No.: PCT/EP2020/079023
§ 371 (c)(1),
(2) Date: Apr. 28, 2022

(87) PCT Pub. No.: WO2021/083673
PCT Pub. Date: May 6, 2021

(65) Prior Publication Data
US 2022/0390388 A1    Dec. 8, 2022

(30) Foreign Application Priority Data
Oct. 29, 2019    (EP) .................................... 19205875

(51) Int. Cl.
*G01N 23/00*    (2006.01)
*G01N 21/33*    (2006.01)
(Continued)

(52) U.S. Cl.
CPC ......... *G01N 21/9501* (2013.01); *G01N 21/33* (2013.01); *G01N 23/20008* (2013.01);
(Continued)

(58) Field of Classification Search
CPC ............... G01N 21/33; G01N 21/9501; G01N 2223/05; G01N 2223/6116;
(Continued)

(56) References Cited

U.S. PATENT DOCUMENTS 6,952,253 B2    10/2005    Lof et al.
7,701,577 B2    4/2010    Straaijer et al.
(Continued)

FOREIGN PATENT DOCUMENTS

EP    1 628 164 A    2/2006
WO    WO 2011/012624 A1    2/2011
(Continued)

OTHER PUBLICATIONS

International Search Report and Written Opinion of the International Searching Authority directed to related International Patent Application No. PCT/EP2020/079023, mailed Feb. 4, 2021; 10 pages.
(Continued)

*Primary Examiner* — Dani Fox
(74) *Attorney, Agent, or Firm* — Sterne, Kessler, Goldstein & Fox P.L.L.C

(57) ABSTRACT

A high harmonic radiation source and associated method of generating high harmonic radiation is disclosed. The high harmonic radiation source is configured to condition a gas medium by irradiating the gas medium with a pre-pulse of radiation, thereby generating a plasma comprising a pre-pulse plasma distribution; and irradiate the gas medium with a main pulse of radiation to generate said high harmonic radiation. The conditioning step is such that the plasma comprising a pre-pulse plasma distribution acts to configure a wavefront of said main pulse to improve one or both of: the efficiency of the high harmonic generation process and the beam quality of the high harmonic radiation. The high (Continued)

harmonic radiation source further may comprise a beam shaping device configured to shape said customized pre-pulse prior to said conditioning.

15 Claims, 7 Drawing Sheets

(51) Int. Cl.
G01N 21/95 (2006.01)
G01N 23/20008 (2018.01)
G02F 1/35 (2006.01)
G03F 7/00 (2006.01)
H05G 2/00 (2006.01)

(52) U.S. Cl.
CPC .......... *G02F 1/354* (2021.01); *G03F 7/70033* (2013.01); *G03F 7/7065* (2013.01); *H05G 2/003* (2013.01); *H05G 2/008* (2013.01); *G01N 2223/05* (2013.01); *G01N 2223/6116* (2013.01)

(58) Field of Classification Search
CPC ... G01N 23/20008; G02F 1/353; G02F 1/354; G02F 7/70033; G02F 7/70616; G02F 7/7065; H05G 2/003; H05G 2/008
See application file for complete search history.

(56) References Cited

U.S. PATENT DOCUMENTS

| | | | |
|---|---|---|---|
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,792,096 B2 | 7/2014 | Straaijer |
| 8,797,554 B2 | 8/2014 | Straaijer |
| 8,823,922 B2 | 9/2014 | Den Boef |
| 2007/0224518 A1 | 9/2007 | Yokhin et al. |
| 2007/0296960 A1 | 12/2007 | Den Boef et al. |
| 2008/0198380 A1 | 8/2008 | Straaijer et al. |
| 2009/0168062 A1 | 7/2009 | Straaijer |
| 2010/0007863 A1 | 1/2010 | Jordanoska |
| 2010/0328655 A1 | 12/2010 | Den Boef |
| 2011/0026032 A1 | 2/2011 | Den Boef et al. |
| 2011/0032500 A1 | 2/2011 | Straaijer |
| 2011/0102753 A1 | 5/2011 | Van De Kerkhof et al. |
| 2011/0102793 A1 | 5/2011 | Straaijer |
| 2011/0188020 A1 | 8/2011 | Den Boef |
| 2011/0249244 A1 | 10/2011 | Leewis et al. |
| 2012/0044470 A1 | 2/2012 | Smilde et al. |
| 2012/0044495 A1 | 2/2012 | Straaijer |
| 2013/0105712 A1 | 5/2013 | Yanagida et al. |
| 2013/0162996 A1 | 6/2013 | Straaijer et al. |
| 2013/0304424 A1 | 11/2013 | Bakeman et al. |
| 2013/0308142 A1 | 11/2013 | Straaijer |
| 2014/0019097 A1 | 1/2014 | Bakeman et al. |
| 2016/0161863 A1 | 6/2016 | Den Boef et al. |
| 2016/0282282 A1 | 9/2016 | Quintanilha et al. |
| 2016/0370717 A1 | 12/2016 | Den Boef et al. |
| 2017/0184981 A1 | 6/2017 | Quintanilha et al. |
| 2017/0322497 A1* | 11/2017 | Lin .......................... G21K 5/04 |
| 2018/0073992 A1 | 3/2018 | Van Voorst et al. |
| 2018/0317309 A1 | 11/2018 | Chang et al. |
| 2018/0368243 A1 | 12/2018 | Smorenburg et al. |
| 2019/0212657 A1 | 7/2019 | Srivastava et al. |

FOREIGN PATENT DOCUMENTS

| | | |
|---|---|---|
| WO | WO 2019/068459 A1 | 4/2019 |
| WO | WO 2019/166190 A1 | 6/2019 |

OTHER PUBLICATIONS

Durfee III et al., "Light Pipe for High Intensity Laser Pulses," Physical Review Letters, vol. 71, No. 15, Oct. 11, 1993; 6 pages.
Gessner et al., "Demonstration of a positron beam-driven hollow channel plasma wakefield accelerator," Nature Communications, vol. 7, Jun. 2, 2016; pp. 1-6.
Popmintchev et al., "Phase matching of high harmonic generation in the soft and hard X-ray regions of the spectrum," Applied Physical Sciences, vol. 106, No. 26, Jun. 30, 2009; pp. 10516-10521.
Lai et al., "The influence of plasma defocusing in high harmonic generation," Optics Express, vol. 19, No. 23, Nov. 7, 2011; pp. 22377-22387.
Major et al., "Phase and group velocity of focused, pulsed Gaussian beams in the presence and absence of primary aberrations," Journal of Optics, vol. 17, No. 6, Jun. 2015; pp. 1-18.
Lemaillet et al., "Intercomparison between optical and x-ray scatterometry measurements of FinFET structures," Proc. of SPIE, Metrology, Inspection, and Process Control for Microlithography XXVII, vol. 8681, Apr. 10, 2013; 8 pages.

* cited by examiner

METHOD AND APPARATUS FOR EFFICIENT HIGH HARMONIC GENERATION

CROSS REFERENCE TO RELATED APPLICATIONS

This application claims priority of EP application 19205875.8 which was filed on 2019 Oct. 29 and which is incorporated herein in its entirety by reference.

FIELD

The present invention relates to generation of high harmonic radiation, and in particular such a high harmonic radiation generator in relation to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Current or near-future measurement tools for the semiconductor industry may be configured to use radiation in the wavelength regime extending roughly from 1 nm to 100 nm, e.g. where visible light is starting to give insufficient spatial resolution for the continuously shrinking feature sizes. One proposal for achieving this is to generate such radiation using high-harmonic generation (HHG) techniques. In HHG, an intense laser pulse of visible or infrared (IR) radiation is focused into a gas target, leading to emission of radiation in the desired range by the gas atoms due to their interaction with the laser light. The HHG-generated light can then focused onto a target on the wafer by means of an optical column that transfers the light from the HHG source to the target. The reflected light is detected and processed to infer properties of the target.

It is desirable to improve generation efficiency and/or beam quality of radiation generated by an HHG source.

SUMMARY

In a first aspect of the invention there is provided a high harmonic radiation source comprising a gas medium and being configured to: condition a gas medium by irradiating the gas medium with a pre-pulse of radiation, thereby generating a plasma comprising a pre-pulse plasma distribution; irradiate the gas medium with a main pulse of radiation to generate said high harmonic radiation, wherein said conditioning step is such that the plasma comprising a pre-pulse plasma distribution acts to configure a wavefront of said main pulse to improve one or both of: the efficiency of the high harmonic generation process and the beam quality of the high harmonic radiation.

In a second aspect of the invention, there is provided a method of generating high harmonic radiation in a high harmonic generation process, comprising: generating a pre-pulse of radiation; conditioning a gas medium with said pre-pulse to generate a plasma comprising a pre-pulse plasma distribution; irradiating the gas medium with a main pulse of radiation to generate said high harmonic radiation, wherein said pre-pulse plasma distribution is configured to configure a wavefront of said main pulse so as to improve one or both of: the efficiency of the high harmonic generation process and the beam quality of the high harmonic radiation.

BRIEF DESCRIPTION OF THE DRAWINGS

Embodiments will now be described, by way of example only, with reference to the accompanying schematic drawings, in which.

DETAILED DESCRIPTION

In the present document, the terms "radiation" and "beam" are used to encompass all types of electromagnetic radiation and particle radiation, including ultraviolet radiation (e.g. with a wavelength of 365, 248, 193, 157 or 126 nm), EUV (extreme ultra-violet radiation, e.g. having a wavelength in the range of about 5-100 nm), X-ray radiation, electron beam radiation and other particle radiation.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
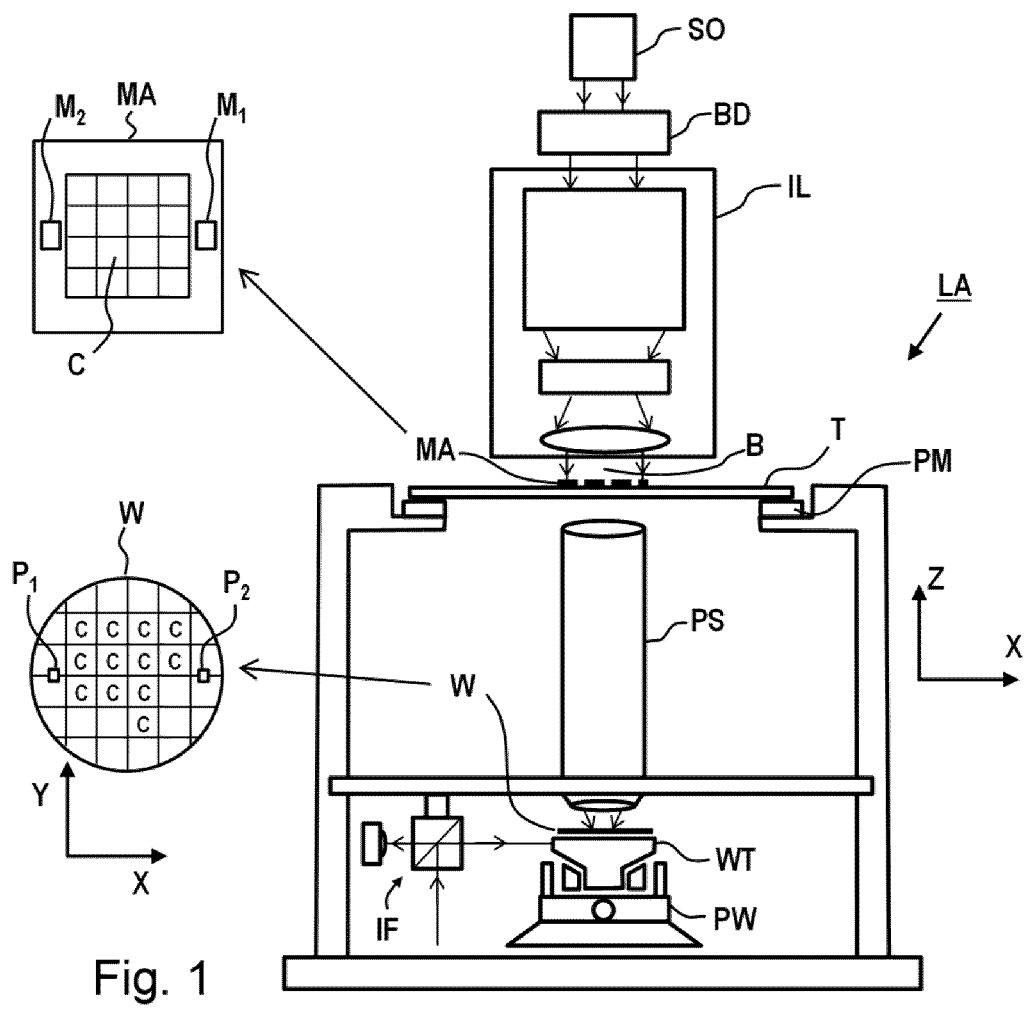
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation, EUV radiation or X-ray radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, diffractive, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, diffractive, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference in its entirety.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
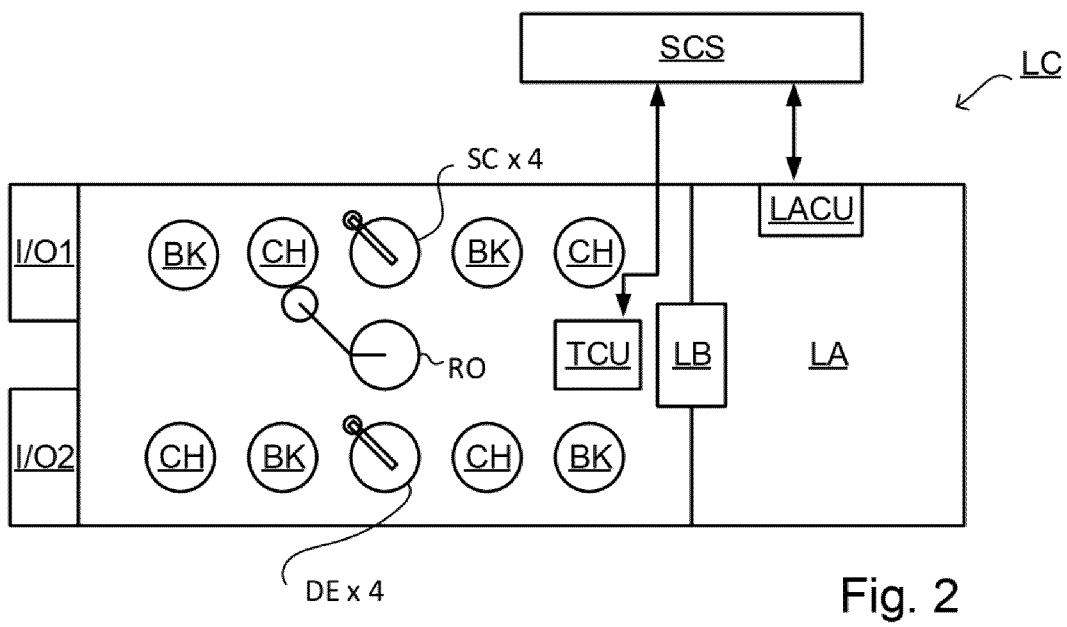
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in an image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, extreme ultraviolet and visible to near-IR wavelength range.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools and/or metrology tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 3:
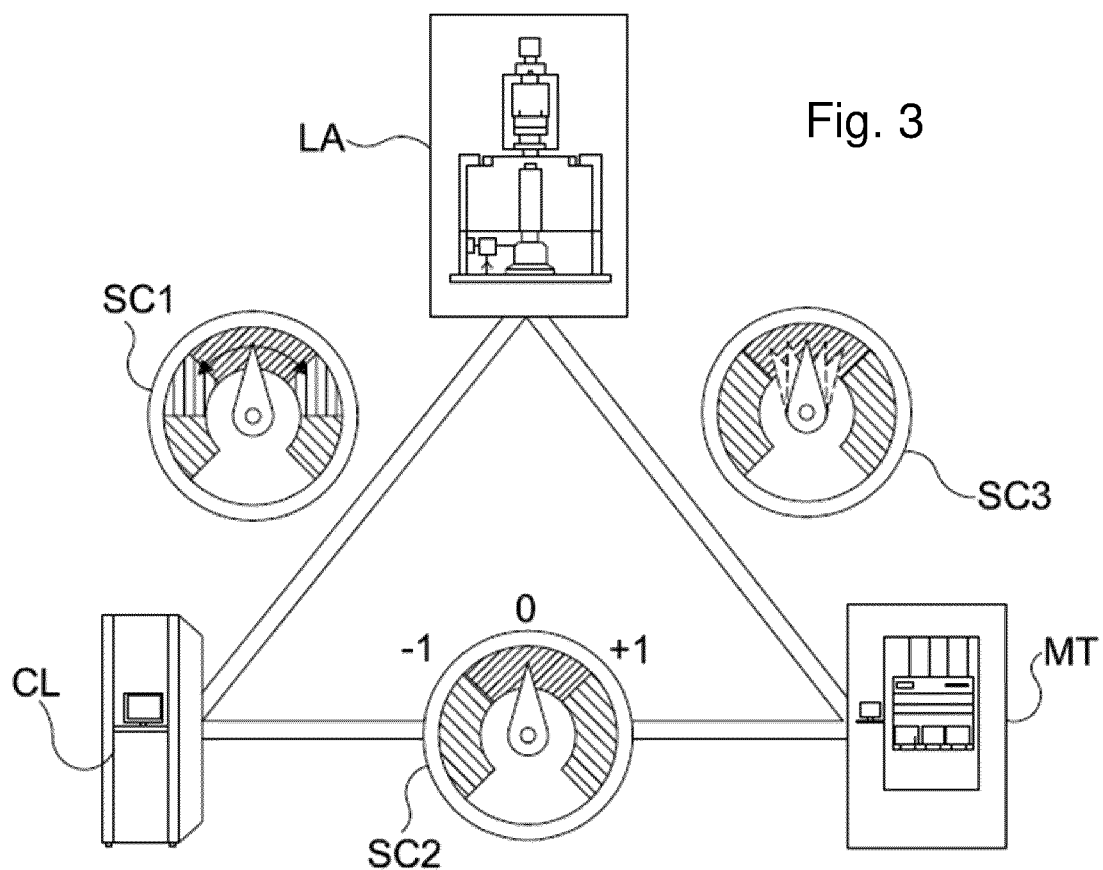
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—within which the process parameters in the lithographic process or patterning process may be allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray, extreme ultraviolet and visible to near-IR wave range.

Figure 4:
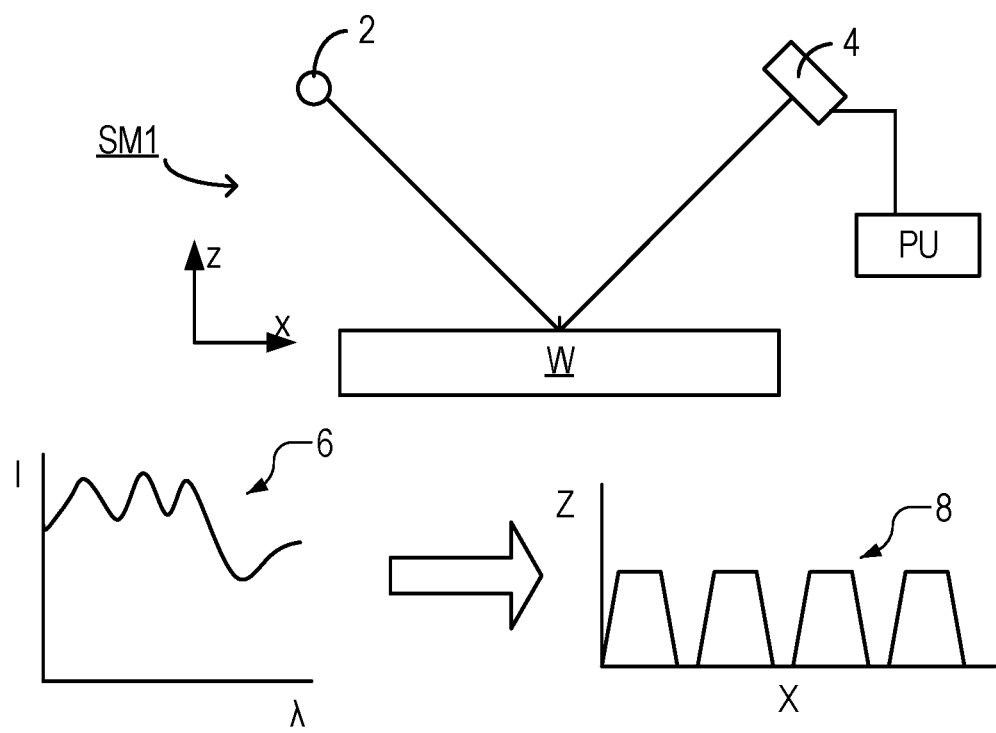
FIG. 4 schematically illustrates a scatterometry apparatus.

A metrology apparatus, such as a scatterometer, is depicted in FIG. 4. It comprises a broadband (e.g. white light) radiation projector 2 which projects radiation 5 onto a substrate W. The reflected or scattered radiation 10 is passed to a spectrometer detector 4, which measures a spectrum 6 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which content is incorporated herein by reference in its entirety). Profile (CD)

measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common. The content of the cited US patent application are incorporated herein by reference in their entirety.

Figure 5:
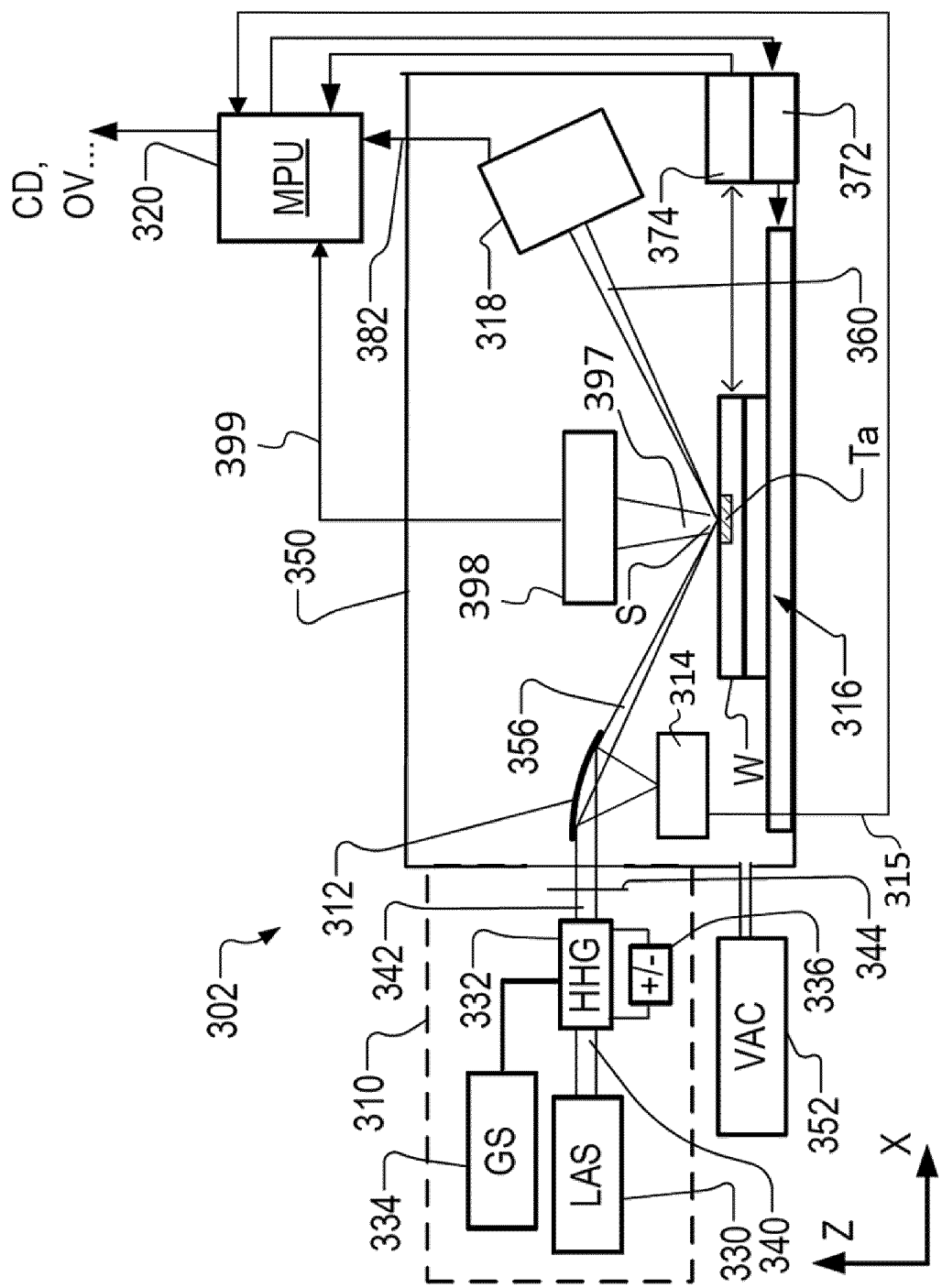
FIG. 5 depicts a schematic representation of a metrology apparatus in which EUV and/or SXR radiation is used.

FIG. 5 depicts a schematic representation of a metrology apparatus 302 in which radiation in the wavelength range from 0.1 nm to 100 nm may be used to measure parameters of structures on a substrate. The metrology apparatus 302 presented in FIG. 5 is suitable for the soft X-rays or EUV domain.

FIG. 5 illustrates a schematic physical arrangement of a metrology apparatus 302 comprising a spectroscopic scatterometer using EUV and/or SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths.

Inspection apparatus 302 comprises a radiation source 310, illumination system 312, substrate support 316, detection systems 318, 398 and metrology processing unit (MPU) 320.

Source 310 in this example comprises a generator of EUV or soft x-ray radiation based on high harmonic generation (HHG) techniques. Main components of the radiation source are a drive laser 330 and an HHG gas cell 332. A gas supply 334 supplies suitable gas to the gas cell, where it is optionally ionized by an electric source 336. The drive laser 300 may be, for example, a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 μm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). N2, O2, He, Ar, Kr, Xe gases can all be considered. These may be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) or Zirconium (Zr) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. For example, one or more wavelengths in the range 1-20 nm or optionally in the range 1-10 nm or optionally in the range 10-20 nm may be chosen. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in published US patent application US2017/0184981A1 (which content is incorporated herein by reference in its entirety), mentioned above. The focusing is performed to achieve a round or elliptical spot S under 10 m in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest. Alternatively, or additionally, substrate support 316 comprises for example a tilting stage that may tilt the substrate W at a certain angle to control the angle of incidence of the focused beam on the structure of interest T.

Optionally, the illumination system 312 provides a reference beam of radiation to a reference detector 314 which may be configured to measure a spectrum and/or intensities of different wavelengths in the filtered beam 342. The reference detector 314 may be configured to generate a signal 315 that is provided to processor 310 and the filter may comprise information about the spectrum of the filtered beam 342 and/or the intensities of the different wavelengths in the filtered beam.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise a soft X-ray and/or EUV spectroscopic reflectometer of the kind described in US2016282282A1 which content is incorporated herein by reference in its entirety.

If the target T has a certain periodicity, the radiation of the focused beam 356 may be partially diffracted as well. The diffracted radiation 397 follows another path at well-defined angles with respect to the angle of incidence then the reflected radiation 360. In FIG. 5, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 5 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage, rotation and/or tilting stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses soft X-ray and/or EUV radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), focus of the lithography apparatus while the lithography apparatus printed the target structure, coherent diffraction imaging (CDI) and at-resolution overlay (ARO) metrology. The soft X-ray and/or EUV radiation may for example have wavelengths less than 100 nm, for example using radiation in the range 5-30 nm, of optionally in the range from 10 nm to 20 nm. The radiation may be narrowband or broadband in character. The radiation may have discrete peaks in a specific wavelength band or may have a more continuous character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

Metrology tools MT, including but not limited to the scatterometers mentioned above, may use radiation from a radiation source to perform a measurement. The radiation used by a metrology tool MT may be electromagnetic radiation. The radiation may be optical radiation, for example radiation in the infrared, visible, and/or ultraviolet parts of the electromagnetic spectrum. Metrology tools MT may use radiation to measure or inspect properties and aspects of a substrate, for example a lithographically exposed pattern on a semiconductor substrate. The type and quality of the measurement may depend on several properties of the radiation used by the metrology tool MT. For example, the resolution of an electromagnetic measurement may depend on the wavelength of the radiation, with smaller wavelengths able to measure smaller features, e.g. due to the diffraction limit. In order to measure features with small dimensions, it may be preferable to use radiation with a short wavelength, for example EUV and/or Soft X-Ray (SXR) radiation, to perform measurements. In order to perform metrology at a particular wavelength or wavelength range, the metrology tool MT requires access to a source providing radiation at that/those wavelength(s). Different types of sources exist for providing different wavelengths of radiation. Depending on the wavelength(s) provided by a source, different types of radiation generation methods may be used. For extreme ultraviolet (EUV) radiation (e.g. 1 nm to 100 nm), and/or soft X-ray (SXR) radiation (e.g. 0.1 nm to 10 nm), a source may use High Harmonic Generation (HHG) to obtain radiation at the desired wavelength(s). Using HHG to obtain EUV and/or SXR radiation is known. One of the challenges faced in the development of these sources is how to improve the efficiency of the HHG process for further power scaling of output in the desired wavelength range.

The properties of the radiation used to perform a measurement may affect the quality of the obtained measurement. For example, the shape and size of a transverse beam profile (cross-section) of the radiation beam, the intensity of the radiation, the power spectral density of the radiation etc., may affect the measurement performed by the radiation. It is therefore beneficial to have a source providing radiation that has properties resulting in high quality measurements.

Described herein are methods, apparatuses, and assemblies for HHG to obtain output radiation at a high harmonic frequency of input radiation or called drive radiation or called pump radiation. The radiation generated through the HHG process may be provided as radiation in metrology tools MT for inspection and/or measurement of substrates. The substrates may be lithographically patterned substrates. The radiation obtained through the HHG process may also be provided in a lithographic apparatus LA, and/or a lithographic cell LC. High harmonic generation uses non-linear effects to generate radiation at a harmonic frequency of provided drive radiation. The drive radiation may be pulsed radiation, which may provide high peak intensities for short bursts of time.

An existing method that has been adopted for producing high harmonic radiation is to focus an intense laser pulse output from a drive laser onto a HHG gas target which may be a gas cell, a gas capillary or a gas jet. Typical peak intensities of the drive laser pulse used in HHG are on the order of $10^{14}$ W/cm$^2$ or higher. When a gas atom interacts with the strong electrical field of the focused laser beam, an electron is ripped from the gas atom. Once liberated, the electron is accelerated by the oscillating laser field to high energies. The corresponding gas atom is ionized and the ionization rate has a sensitive dependence on the drive laser pulse intensity. Following the acceleration, the high energy electron may re-collide with its parent ion. If such re-collision happens, the excess kinetic energy acquired during the interaction with the external electrical field is emitted as a high energy photon, having a wavelength for example in the EUV and/or X-ray (XR) part of the electromagnetic spectrum. The maximum photon energy (or so-called single atom cut-off energy) is proportional to the laser intensity and the square of the laser wavelength. Therefore, in order to produce radiation with high photon energies (or shorter wavelengths), a drive laser with a higher intensity and a longer wavelength is strongly desired. The emitted photons from all the interacting gas atoms constitute the final output of the high harmonic radiation source.

To achieve any significant output power in a high harmonic radiation source, individual interacting atoms in the HHG gas target should emit their photons in a coherent manner. In other words, the electromagnetic waves emitted from a large number of individual radiating atoms over an extended region of highly nonlinear medium should add in-phase and form a coherent emission. The benefit of generating coherent emission is that the output radiation of a high harmonic radiation source is a coherent build-up of harmonic radiation from all the radiating atoms (e.g., N radiation atoms). Hence the total power of the output radiation is proportional to the square of the number of the radiating atoms, i.e. $N^2$. This is in contrast with incoherent emission, where the output power is proportional to the number of the radiation atoms, i.e., N. Therefore, coherent emission is desired for generating higher output power. To generate such coherent emission, the drive laser and the generated harmonic radiation (EUV and/or XR radiation) should travel at the phase velocity in the highly nonlinear medium (e.g., a gas medium) such that the drive laser may continuously excite a plurality of gas atoms within the HHG gas target to produce a plurality of individual harmonic waves, which due to being in phase, are constructively interfered to form a strong HHG output. Maintaining such a phase matching condition over a sufficient interaction distance, determined partly by the characteristics of the drive laser (e.g., beam divergence, intensity, etc.), is important for power scaling of a high harmonic radiation source.

However, at present, most applications of high harmonic radiation sources are limited to relatively low output powers and/or low photon energies due to the difficulty of continuously power scaling the output without compromising the phase matching condition. Although high harmonic radiation sources have been used in various types of above-mentioned metrology tools, the throughput of those metrology tools have suffered by the insufficient power of high harmonic radiation sources. It is highly desirable to further improve on the existing power scaling methods so as to develop a high harmonic radiation source which is able to produce sufficient output power in the EUV and/or XR region such that throughput in metrology applications using such a high harmonic radiation source is at an acceptable level and therefore cost effective.

Like other nonlinear optical conversion processes, such as second harmonic generation, Raman effect or optical Kerr effect, the efficiency of the HHG process is sensitively dependent on the peak intensity of the drive radiation, i.e., a higher laser intensity is desired for achieving a higher optical conversion efficiency. The optical efficiency of the HHG process is defined as the power ratio between the power of the generated harmonic radiation and the power of the drive radiation. High drive laser intensities are mainly achieved by focusing the drive laser beam to a small spot size, which depending on specific requirement/application, is often combined with scaling the drive laser power and shortening the drive laser pulse-length. However, it is known that the on-axis phase velocity of a focused laser beam changes along the focus and reaches its maximum at the diffraction focus. The variation in phase velocity results in a phase mismatch between the drive laser and the generated high harmonic wave when travelling through the focus region. Consequently, the phase matching distance, over which the phase matching condition is sufficiently satisfied, is significantly shortened and the HHG conversion efficiency is badly impaired.

Since the phase velocity is a function of the refractive index of a nonlinear medium, it may be tuned by varying the refractive index of the medium. For a gas medium, the refractive index is proportional to the density of the gas atoms which may be adjusted through the change of the gas pressure. A higher gas pressure results in a higher density of gas atoms which in turn leads to a higher refractive index of the gas volume. With a higher refractive index, the phase velocity of the drive laser is reduced bringing the drive laser and the generated harmonic field back in phase. As such, the focusing induced phase mismatch is overcome. Therefore, adjusting gas pressure may be adopted to tune the dispersion of a gas medium.

However, a significant complication generic to high harmonic radiation sources is the creation of plasma. As mentioned above, after interacting with the high intensity drive laser, the gas is partly ionized. The resulting mixture of the liberated electrons, ionized gas atoms and neutral atoms is a plasma. The optical effect associated with the creation of a plasma is that the effective refractive index of the gas volume where a plasma is present will be lowered. The effective refractive index $n_{eff}$ of a plasma is described as: $n_{eff}=1-C^*n_e$, where C is a constant and $n_e$ is the density of the liberated free electrons. The change (e.g., decrease) in effective refractive index in turn changes (e.g., increases) the phase velocity of laser light travelling through the plasma. Therefore, laser light propagates faster at locations in the HHG gas target having a higher electron density (corresponding to a high degree of ionization) than at locations with a low or zero electron density (corresponding to a low degree of ionization). The plasma induced phase velocity variation results in a distorted wavefront of the drive laser. In the case of an inhomogeneous distribution of ionization, the plasma induced decrease of refractive index causes laser light to diffract away from regions with a high degree of ionization and a low effective refractive index, a process called plasma defocusing.

In a typical situation where no pre-ionization is present, the highest degree of ionization takes place where the drive laser beam has the highest intensity, i.e. on the beam axis of the focus. As such, the effective refractive index is lower in the beam centre than at the edge of the laser beam. When the drive laser propagates along the focus and through the plasma, plasma defocusing bends (diffracts) the drive laser beam away from its beam axis such that the drive laser beam gets defocused (or expanded). As a result, the wavefront of the drive laser is distorted and hence the intensity distribution of the drive laser beam is deteriorated, which in turn degrades the output beam quality of the high harmonic radiation source. Beam quality may be defined is the beam parameter product or $M^2$ at each wavelength, combined with a low chromaticity of the focal plane position, such that chromatic focusing is minimized.

A poor beam quality means the minimum achievable spot size after focusing is much larger than the theoretical limit (or diffraction limit) achievable with a perfect Gaussian beam. Therefore, when applying such a high harmonic radiation source in a metrology system, e.g., as described in FIG. 5, the optical resolution of the system will be poor. This is clearly undesirable for metrology applications where optical resolution may be maximized for inspecting and measuring semiconductor wafers with ever-shrinking CDs. Moreover, plasma defocusing significantly reduces the peak intensity of the drive laser and restricts the high intensity region to only an upstream side (add e.g. along the drive laser propagation direction) of the HHG gas target where the gas pressure starts to build up, resulting in a poor HHG efficiency and a low output power. The plasma induced phase velocity (or refractive index) variation negatively impacts the phase matching condition for the HHG process and therefore further degrades the HHG efficiency.

As mentioned above, the pressure of a HHG gas target may be increased to compensate for the focus induced phase mismatch and to maximize the phase matching distance between the fundamental wave and the generated harmonic wave. However, a higher pressure results in a higher gas density. With a higher gas density, more gas atoms are ionized by the drive laser and therefore a stronger plasma is created which subsequently causes stronger plasma defocusing to the drive laser beam. Plasma defocusing is detrimental to the HHG efficiency and output beam quality. However, suppressing such plasma defocusing by keeping the gas pressure low would on the other hand impair the phase matching condition for the HHG process, giving rise to the same problem of a low HHG efficiency. Therefore, in high harmonic radiation sources, it is challenging to provide both a sufficiently high gas pressure to ensure good phase matching, and a sufficiently low gas pressure to prevent excessive plasma defocusing. The result is often a trade-off where both, i.e., phase matching and suppression of plasma defocusing, are an acceptable compromise, but neither is optimal. Accordingly, the usable range of gas pressure is significantly restricted by this trade-off.

A method and apparatus are disclosed herein to resolve the above mentioned trade-off. The method and apparatus may reduce the limitations, imposed by the plasma defocusing effect, on the usable pressure range of a HHG gas target and thereby enable a high harmonic radiation source to emit high harmonic radiation with a higher power. The proposed method comprises hitting the gas target of a high harmonic radiation source with a pre-pulse which may have a customised spatial distribution, prior to the arrival of the main drive laser pulse. The pre-pulse is used to condition the gas target by deliberately pre-ionizing a certain part of the gas target such that a corresponding spatial distribution (or pattern) of pre-ionization is generated. When the pre-ionization pattern is suitably chosen, it counteracts the subsequent detrimental plasma defocusing effect suffered by the main pulse. In such a manner, the high harmonic radiation source may output high harmonic radiation with high power and high beam quality, having desired wavelengths in the EUV and/or SxR region (e.g., output radiation comprising one or more wavelengths in a region between 0.01 nm-100 nm, between 0.1 nm-100 nm, between 1 nm-100 nm, between 1 nm-50 nm, between 1 nm-20 nm, between 5-20 nm, between 10-20 nm or between 10-18 nm). Using this output high harmonic radiation as an illumination beam, a metrology system (e.g., as described in FIG. 5) will be able to provide a higher throughput and/or a better optical resolution.

Since the distribution of ionization follows the spatial profile of the drive laser beam, to suppress plasma defocusing, the pre-pulse may have an inverted spatial profile as that of the drive laser beam such that when combining the drive laser excited ionization with the pre-pulse excited ionization, a substantially homogeneous distribution of ionization is formed. This is based on the assumption that the degree of ionization induced by the pre-pulse is comparable to or the same as that induced by the drive laser. In practice, partial suppression of plasma defocusing may be sufficient to significantly increase the HHG efficiency and thereby the power of the high harmonic radiation and any pre-pulse spatial profile which at least partially suppresses plasma focusing is comprised within the scope of the teachings herein.

Figure 6:
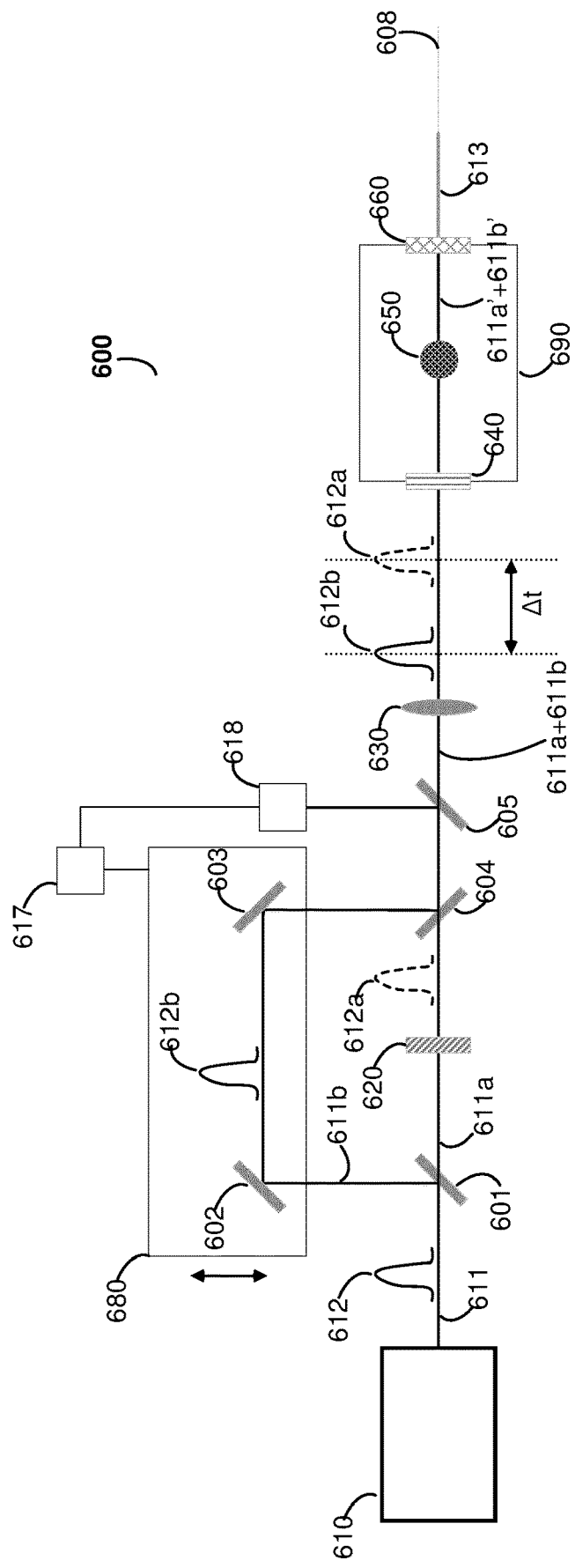
FIG. 6 schematically illustrates a single-laser based high harmonic radiation source in accordance with a first embodiment.

FIG. 6 illustrates schematically a high harmonic radiation source in accordance with a first embodiment. A drive laser 610 is used to output a drive laser beam 611 optionally comprising a train of short pulses. The drive laser beam 611 may have a Gaussian beam profile and may comprise radiation with one or more wavelengths higher than the one or more wavelengths of the high harmonic radiation. The drive radiation may comprise infrared radiation. The drive radiation may comprise, for example, radiation with wavelength(s) in the range of 200 nm to 2500 nm, in the range of 800 nm to 1500 nm, in the range of 900 nm to 1300 nm, or in the range of 1000 nm to 1300 nm. The drive radiation may be pulsed radiation. Pulsed drive radiation may comprise pulses with a duration in the femtosecond (fs) range. For example, the pulse duration of the pre-pulse and/or main pulse may be in the range of 1 fs to 1 ps, 1 fs to 500 fs, or 1 fs to 100 fs for example. Pulsed drive radiation may have a repetition rate in the range of a few hertz (Hz) to a few hundred megahertz (MHz).

After passing through a beam splitter 601 (e.g., a dichroic mirror), the drive laser beam 611 is split into two beams, i.e., the pre-pulse beam 611a and the main pulse beam 611b. Correspondingly, a drive laser pulse 612 is split into pre-pulse 612a and main pulse 612b. The main pulse 612b is reflected by a first beam splitter 601 into an optical delay line 680 which may comprise two optical mirrors 602 and 603. The reflectivity of the front surface of the beam splitter, on which the drive laser impinges first, may be flexibly configured by choosing suitable mirror coatings. The optical delay line 680 may be translated such that the delay time between the main pulse 612b and the pre-pulse 612a may be flexibly controlled. In this embodiment, the main pulse is delayed with respect to the pre-pulse by a predetermined amount of time Δt. The delay time Δt may be in the range of a few fs to a few hundred fs. The delayed main pulse beam 611b is subsequently guided, via a second beam splitter 604, to spatially overlap with the pre-pulse beam 611a.

In an optional embodiment, a small portion of the spatially combined beams 611a, 611b may be guided into a timing detection device 618, e.g., a fast photo-detector, by a third beam splitter 605 to precisely measure the delay time between two pulses. The measured delay time may be compared with a target delay time so as to generate a timing error. Such a timing error may be fed back to the control system 617 of the optical delay line 680 such that the delay time may be adjusted in order to minimize the received timing error.

After transmitting through the beam splitter 601, the pre-pulse beam 611a may pass through a beam shaping device 620 which modifies the phase distribution (wavefront) and/or the intensity distribution of the pre-pulse beam in a customized manner. Modifying a phase distribution may refer to modifying the phase at one or more points within the beam (i.e., with respect to the phase at any, e.g., arbitrarily chosen, reference point). Such a modified phase distribution will influence the subsequent propagation of the beam. Such a beam shaping device 620 may shape the spatial distribution of the pre-pulse in terms of intensity and/or phase. The beam shaping device 620 may comprise, for example, one or a combination of: a phase modulation component or intensity modulation component; e.g., one or a combination of a phase plate with a fixed phase pattern, a spatial light modulator (SLM) with a programmable/configurable phase pattern or an aperture with a fixed or programmable/configurable pattern. The modified pre-pulse beam is then spatially overlapped with the delayed main-pulse beam after passing through the optical mirror 604. Note that even though the pre-pulse beam and the main pulse beam are spatially overlapped, the pre-pulse and the main pulse comprised in their respective laser beams, are temporally separated by a delay time Δt.

The spatially overlapped but temporally separated laser pulses (pre-pulse 612a and main pulse 612b) may be then focused by an optical lens 630 into a vacuum or near vacuum vessel 690. The vacuum vessel 690, connected to a vacuum pump (not shown), comprises an input optical window 640, being configured to allow a high optical transmission of the input laser pulses (or beams), and an output optical window, being configured to allow a high optical transmission of the generated harmonic radiation while optionally blocking (reflecting or absorbing) the residual (or unconverted) fundamental radiation, i.e., residual pre-pulse beam 611a' and residual main pulse beam 611b'. Within the vacuum vessel 690, the focal plane of the pre-pulse beam 611a may overlap with that of the main pulse beam 611b. The overlapped focal plane may be located at the centre of the gas target 650 and normal to the propagation axis of the laser pulses which may be overlapped with the axis of the vacuum vessel (as illustrated in both FIG. 6). In an embodiment, the gas target 650 may be a gas cell in a different shape. Alternatively, the gas target 650 may be a gas jet or a fiber/capillary filled with gas. In some embodiments, the two focal planes, i.e., the focal plane of the pre-pulse beam 611a and the focal plane of the main-pulse beam 611b, may be not overlapping and instead may be generated at different locations within the gas target 650. This will be described in detail below.

After being focused onto the gas target 650, the pre-pulse beam 611a comprising a pre-determined (e.g., customized) phase and/or intensity distribution (wavefront) pre-ionizes the gas target 650. Since the delay time between the pre-pulse and the subsequent main pulse is on a femtosecond timescale, the liberated electrons (following pre-ionization) may not have sufficient time to diffuse elsewhere within the gas target 650. As such, the spatial distribution of the plasma may follow that of the pre-pulse beam 611a. In other words, the pre-pulse beam 611a imprints its spatial distribution on the electron/plasma distribution, which may stay substantially the same until the subsequent main pulse arrives and the HHG radiation is generated.

In an embodiment, the beam shaping device 620 shapes the spatial distribution of the pre-pulse to have an off-axis intensity distribution. Such an off-axis intensity distribution is such that the imposed intensity distribution is concentrated outside of a central or axial region; e.g., this spatial distribution is concentrated in an outer or peripheral region (e.g., immediately surrounding the central region) with respect to the central region. The result of a pre-pulse shaped by such a beam shaping device, therefore, is the generation of an off-axis plasma having greater plasma density outside of the central region; e.g., there is more plasma generated outside of the plasma region than inside the plasma region. Note that this is effect of the pre-pulse alone; the effect of the combination of pre-pulse and main pulse may be to substantially homogenize the plasma distribution, at least to a degree such that the effect of the pre-pulse is a more homogenous plasma after the main pulse with respect to the situation without the shaped pre-pulse.

Figure 7:
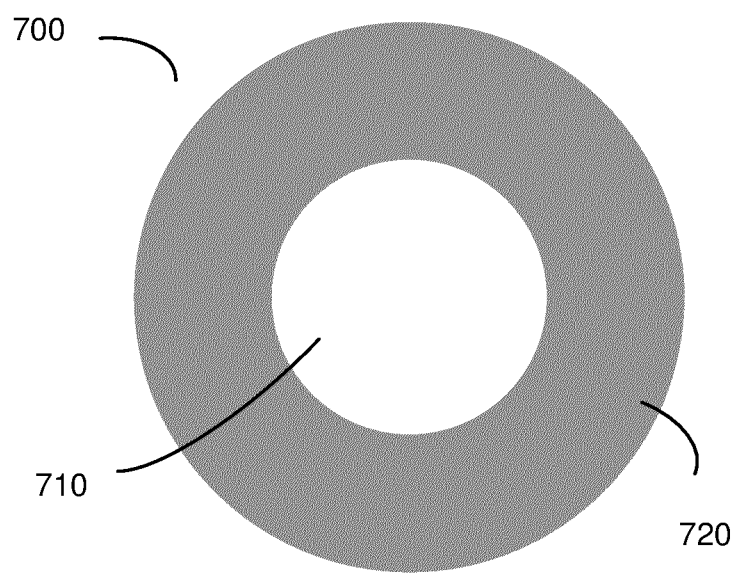
FIG. 7 schematically illustrates an annular shaped plasma distribution in accordance with an embodiment.

In an embodiment, the beam shaping device may impose a substantially annular intensity distribution on the pre-pulse. After pre-ionization, the resultant spatial distribution of the plasma will also show an annular-shaped profile 700, as illustrated in FIG. 7. Such an annular-shaped profile 700 comprises a central or axial region (hollow core) 710 having negligible or at least relatively lower plasma density within with respect to a peripheral or outer region 720 immediately outside of this axial region (e.g., within an annular region 720 and possibly having an annular distribution). Plasma having such an annular-shaped distribution may also be called a plasma tube. Such an annular-shaped plasma distribution is substantially opposite to the plasma distribution resulting from the main pulse, where the plasma is concentrated within the central (axial) region (where the intensity is highest). In some other embodiments, the intensity and/or phase distribution (wavefront) of the pre-pulse may be modified in a different way such that a different spatial distribution of ionization/plasma may be generated.

In a specific embodiment, beam shaping device 620 may comprise a phase modulator or phase plate/SLM which modifies the wavefront of the pre-pulse beam 611a to obtain a customized pre-pulse as described.

In other embodiments, the beam shaping device may be dispensed with altogether. While in the above description, a pre-pulse is actively customized by a beam shaping device or wavefront modification, it should be appreciated that this is optional. In other embodiments, the pre-pulse is not actively shaped. Such embodiments may use a long pre-pulse/thermal shock-driven pre-pulse which utilizes an ordinary Gaussian pre-pulse. Such a shock-driven pre-pulse technique is described, for example, in the publication by C. G. Durfee III and H. M. Milchberg, "Light Pipe for High Intensity Laser Pulses"; *Physical Review Letters Vol.* 71, *No.* 15, which is hereby incorporated herein by reference.

It should be appreciated that a customized pre-pulse may be obtained without a separate beam shaping device; a pre-pulse laser may be configured to emit shaped pre-pulses (e.g., annular pre-pulses).

Since both pulses are originated from the same drive laser pulse 612, the pre-pulse 612a and the main pulse 612b therefore have substantially the same pulse-length. Similarly, both the pre-pulse beam and the main pulse beam may have substantially the same beam diameter. This is based on the assumption that the optical components in both optical arms cause negligible or the same amount of temporal/spatial distortion to both beam. Alternatively, it is possible to include optical components is one or both branches to enable adjustment of one (or both) of the beam diameters; e.g., using a telescopic lens configuration. In order to counteract the aforementioned effects, i.e., plasma defocusing and plasma induced phase mismatch, the degree of ionization resulting from the pre-pulse may be sufficiently close to that resulting from the main pulse. In this way, the annular plasma distribution resulting from the pre-pulse induced ionization may compensate and (at least partially) homogenize the inhomogeneous plasma distribution resulting from the main pulse induced ionization. Consequently, the overall plasma distribution that the main pulse subsequently sees and interacts with during the HHG process is significantly more homogeneous. A more homogeneous distribution of plasma leads to a more homogenous distribution of refractive index, causing less wavefront distortion to the main pulse beam 611b and therefore weaker plasma defocusing and phase mismatching effects. As such, both the HHG efficiency and the beam quality of generated high harmonic radiation are improved.

The generated high harmonic radiation may comprise one or more harmonics of the drive radiation wavelength(s), for example second, third, fourth . . . , nth harmonics of the drive radiation wavelength(s). The high harmonic radiation may comprise wavelengths in the extreme ultraviolet (EUV), soft X-Ray (SXR), and/or hard X-Ray part of the electromagnetic spectrum. The high harmonic radiation may comprise wavelengths in the range of 0.01 nm to 100 nm, in the range of 0.1 nm to 100 nm, in the range of 0.1 nm to 50 nm, in the range of 1 nm to 50 nm, in the range of 5 nm to 20 nm, in the range of 10 nm to 20 nm or in the range of 10 nm to 18 nm.

Figure 8:
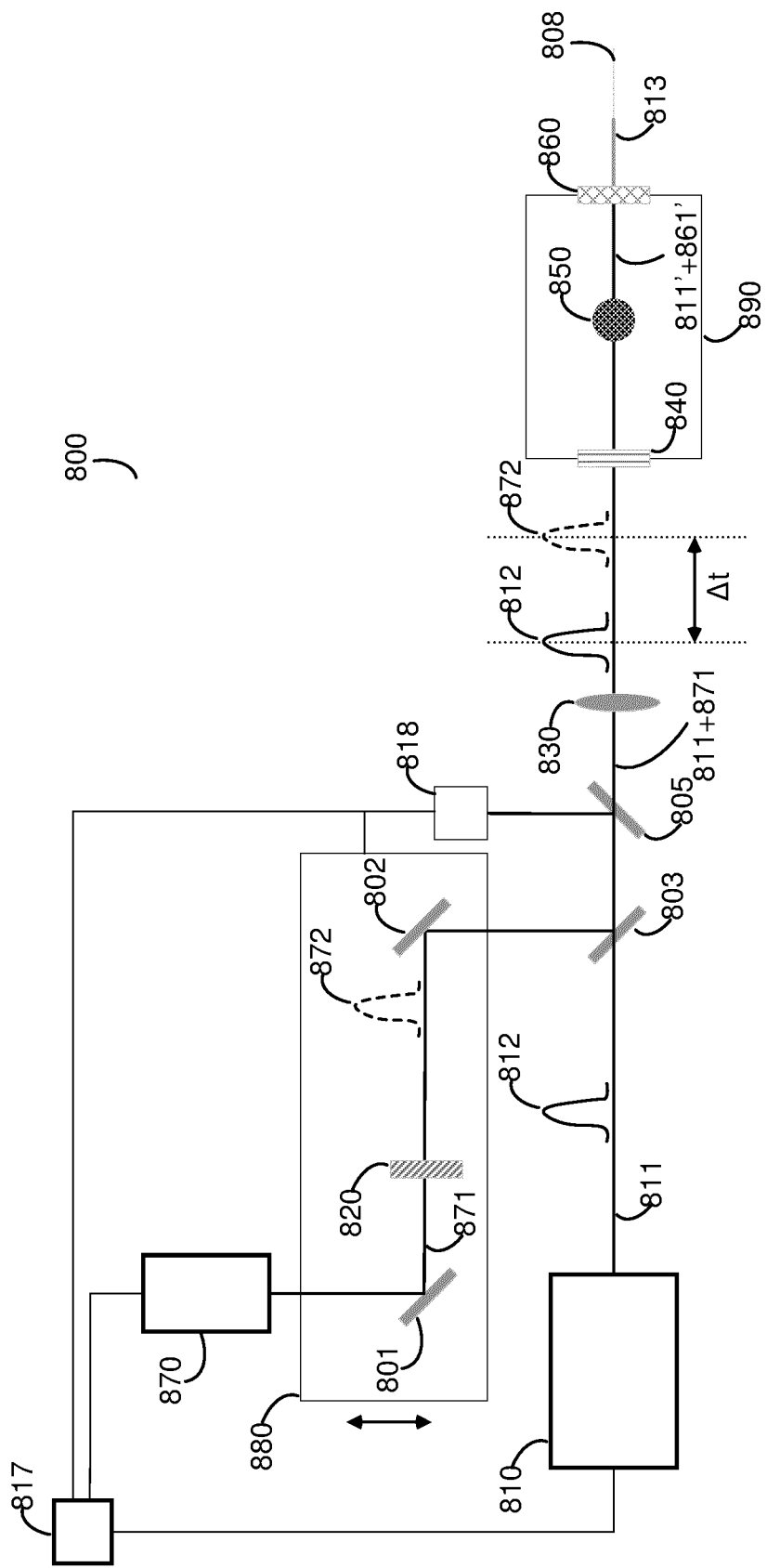
FIG. 8 schematically illustrates a dual-laser based high harmonic radiation source in accordance with a second embodiment.

FIG. 8 illustrates schematically a high harmonic radiation source in accordance with a second embodiment. In this embodiment, a drive laser 810 is used to output a drive laser beam 811 comprising a train of short pulses, e.g., main pulse 812. The pulse 812 is used as the main drive pulse for generating high harmonic radiation. The aforementioned characteristics, e.g., pulse duration, wavelength, and reception rate, of the main pulses apply equally to this embodiment. Different from the first embodiment, this embodiment uses a separate laser (or pre-pulse laser) 817, instead of the same drive laser, to provide the pre-pulses. Since the degree of ionization is proportional to the peak intensity of pulsed radiation, to achieve the same degree of ionization, the separate pre-pulse laser may output pulsed radiation with a similar peak intensity as that of the main pulse. The use of a separate pre-pulse laser allows for a flexible selection of pulse characteristics. For example, when a shorter pulse-length is selected, the required pulse energy may be lowered (in order to maintain the same peak intensity). A laser source producing low energy pulses is more cost effective than the high energy counterpart. This is due to the fact that generation of high energy pulses typically requires a more complex laser design, e.g., more amplification stages. The wavelength of the pre-pulse laser may be chosen to be close to that of the main pulse laser. The pre-pulse laser may be a femtosecond passively mode-locked solid-state laser, such as a femtosecond Nd:YAG laser or a femtosecond Yb:YAG laser.

The pre-pulse laser 817 emits a pre-pulse laser beam 871 comprising a train of short pulses, e.g., pre-pulse 872. The pre-pulse 872 is directed by an optical mirror 801 to pass through a beam shaping device 820 which customizes the intensity and/or phase distribution of pre-pulse 872. After being shaped, the pre-pulse is then directed by another optical mirror 802 towards a beam splitter 803 where the pre-pulse 872 and the main pulse 812 overlap spatially. A portion of the two spatially overlapped but temporally separated pulses may be directed by a beam splitter 805 to an optional timing detection device 818.

The separate laser 817 may have a repetition rate that is equivalent to or a harmonic of that of the drive laser. This allows the two pulse trains emitted respectively from the drive laser and the pre-pulse laser to be synchronized in the time domain. Said synchronisation means that the temporal positions of the pulses from the two separate lasers either temporally coincide or have a fixed delay time. Such timing synchronization may be achieved and subsequently maintained using, for example, a timing synchronisation system. The timing synchronisation system may comprise a control system 817 that controls the timing synchronisation system, and a timing detection device 818 that precisely detects the timing difference between the main pulse 812 and the pre-pulse 872 and sends a corresponding timing error to the control system 817. Upon receiving the timing error from the timing detection device 818, the control system 817 subsequently commands a locking mechanism (not shown) so as to adjust the timing of one or both laser pulses, e.g., via tuning cavity lengths. As such, the timing error signal received from the timing detection device is minimised. Additionally, the delay time $\Delta t$ between the pre-pulse and the main pulse may be controlled by an additional optical delay line 880 comprising the above mentioned optical mirrors 801, 802 and the beam shaping device 820. The delay time $\Delta t$ may be in the range of several fs to several hundred fs; e.g., 1 fs to 1 ps, 1 fs to 500 fs or 1 fs to 100 fs.

In an extension of the above, the pre-pulse concept described herein may be combined with the concept of two-color HHG. In such an embodiment, the pre-pulse may be chosen to have a different wavelength than the main pulse. It is known, for example, that driving HHG with a main pulse overlapped with its 2nd harmonic may increase conversion efficiency and modify the output radiation beam shape. Therefore an optional embodiment may comprise using a second color laser for generating the pre-pulse such that it has a different wavelength to that of the main pulse. In such an embodiment, the second color laser, in addition to generating the pre-pulse, can also be used as a second color driver; e.g., to generate a second harmonic pulse for overlapping the main pulse during HHG generation.

Similar to the first embodiment, a beam shaping device 820, e.g., a phase plate, is used to shape or customize the intensity and/or phase distribution of the pre-pulse 872 such that after being focused onto the gas target 850, it pre-ionizes the gas and creates a desired spatial distribution of plasma. After transmitting through the beam shaping device 820, the pre-pulse 872 is guided by optical mirrors 802 and 803 to spatially overlap with the main pulse 812 coming from the drive laser 810. Again, even though the laser beam 871 comprising the pre-pulse 872 is spatially overlapped with the laser beam 811 comprising the main pulse 812, the two pulses 872 and 812 are temporally separated by a predetermined delay time of $\Delta t$. The spatially overlapped but temporally delayed pulses 872 and 812 are subsequently focused by an optical lens into a vessel 890.

The vessel 890 is essentially the same as the one described in the first embodiment. It comprises an input optical window 840 configured to be highly transmissive for the pre-pulse and the main pulse, and an output optical window 860 configured to be highly transmissive for the generated high harmonic radiation but highly absorptive/reflective for the residual fundamental radiation. After being admitted into the vacuum vessel, similar to the first embodiment, the two input pulses 872 and 812 may be consecutively focused onto the same focal plane. In such a manner, the pre-pulse excited plasma distribution may sufficiently counter-balance the main pulse excited plasma distribution giving rise to a more homogeneous plasma distribution and a less distorted main pulse wavefront. Consequently, a higher HHG efficiency and a better HHG beam quality may be obtained.

Referring back to FIG. 6 and FIG. 8, both embodiments may comprise additional optical components/devices to provide additional functions and/or better optical control. For example, two or more optical mirrors may be added between the beam splitter 605, 805 and the optical lens 630, 830 to increase the flexibility and accuracy in controlling the laser beams before entering into the vacuum vessel 690, 890. Also, one or more beam measuring devices may be comprised within the apparatus to monitor and stabilize the pointing of both laser beams, 611*a*, 871 and 611*b*, 811. Since the HHG process is polarization dependent, using a circularly polarized pre-pulse may effectively eliminate pre-pulse induced high harmonic radiation. Hence, an additional wave-plate may be added to the beam path of the pre-pulse in both embodiments 600, 800 such that the polarisation of the pre-pulse may be converted to circular polarisation. Alternatively, for the second embodiment in FIG. 8, the pre-pulse laser 870 may directly emit a circularly polarised laser beam.

In addition to additional components in the common beampath, it is also possible to add additional components in one of the arms. This enables e.g. control of one beam relative to the other which may enable for example, separate control of beam sizes, transverse focus sizes and/or focal plane locations.

Due to spatiotemporal aberrations, e.g., during the HHG process, the wavefront of high harmonic radiation may be subject to a chromatic focusing effect. As high harmonic radiation often covers a broad spectral range, a highly distorted wavefront will result in a strong chromatic focusing effect; a consequence of this chromatic focusing effect is that different wavelengths of the high harmonic radiation will be focused to different locations along the optical axis when focused by a lens. Each color may individually have a perfectly behaving wavefront, while still be focused onto different planes resulting in this chromatic focusing effect. In this regard, it should be appreciated that aberrations (i.e., poor beam parameter product) and chromatic focus are two different things. A perfect wavefront is spherical in shape and aberrations (characterised by a large beam parameter product) are essentially deviations from the perfect spherical shape. In contrast, the chromatic focusing effect is a result of different colors having a different radius of curvature of the otherwise spherical shape. The chromatic distribution of focal lengths, or chromatic focusing effect, significantly increases the focal volume and negatively impacts the resolution, in particular the vertical (or depth) resolution of an imaging system, e.g., a metrology/inspection system.

The methods of tailoring the main pulse intensity and phase distribution with an appropriately prepared pre-pulse plasma as disclosed herein may be used to suppress one or both of said chromatic focusing effect and the aberration induced wavefront distortion of the high harmonic radiation. This may be achieved by creating an effective phase plate inside the gas target such that the wavefront of the main pulse may be pre-shaped by this effective phase plate before commencement of the HHG process. When the pre-shaped wavefront interacts with the gas target for HHG, the spatiotemporal aberrations that are generated during the HHG process are properly compensated and therefore the chromatic focusing effect may be suppressed. The effective phase plate is created by imprinting the spatial pattern of the pre-pulse onto the gas target such that a desired plasma distribution is formed. Since the effective refractive index of the plasma is different from that of the neutral gas, the pre-pulse induced plasma distribution may hence be used as a phase plate. The effective phase plate may be created before the focus of the main pulse. This means the focal plane of the pre-pulse beam may be located before that of the main pulse beam. The position of the pre-pulse focal plane may be adjusted by varying the divergence of the pre-pulse beam. This may be achieved by passing the pre-pulse beam through an additional lens.

The degree of suppression of aberrations and/or of chromatic focus will depend on how well the spatiotemporal aberrations are compensated. It is noted that the focal plane of the pre-pulse beam may be located at a location within the gas target where sufficient pre-ionization may be generated and the ionization generated by the delayed main pulse is significantly weaker. The main pulse excited ionization may be 10 times, 20 times, 50 times or 100 times weaker than that excited by the pre-pulse.

Figure 9:
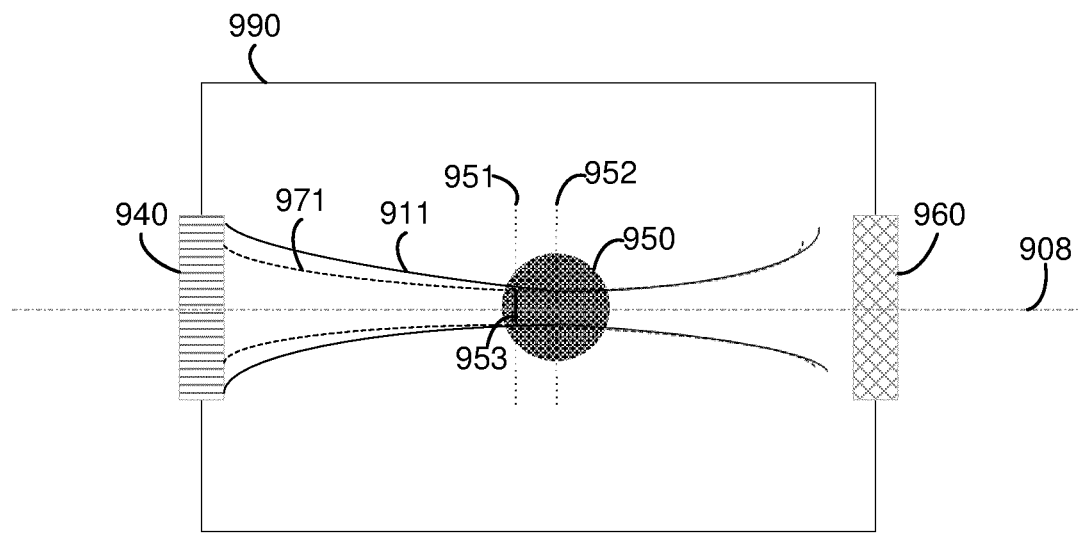
FIG. 9 schematically illustrates an alternative focusing configuration comprising two focal planes in accordance with an embodiment.

FIG. 9 illustrates schematically a focusing configuration for suppressing the chromatic focusing effect in accordance with a further embodiment. In this embodiment, the focal plane 951 of the pre-pulse beam 971 and the focal plane 952 of the main pulse beam 911 are deliberated generated at two different locations within the gas target 950 and along the propagation axis 908. In this way, the pre-pulse induced plasma acts as an effective phase plate 953 which based on the spatial profile of the pre-pulse beam 911, modifies the wavefront of the subsequent main pulse beam 911 in a controlled manner. After being modified by such an effective phase plate 953, the main pulse beam 911 with a pre-shaped wavefront will subsequently interact with the gas target to generate high harmonic radiation. In this way, the spatiotemporal aberrations of the generated high harmonic radiation may be minimized and thereby the chromatic focusing effect may be suppressed. It is noted that this focusing configuration may be applied to any of the above-mentioned embodiments. It is also possible that two different gas targets may be used: a first for shaping, and a second for HHG, each being respectively optimized in terms of one or more of: gas species, geometry, pressure, etc., as appropriate for the two different functions.

Figure 10:
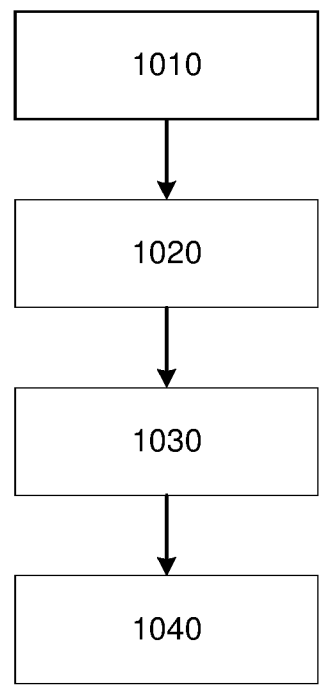
FIG. 10 comprises a flow diagram of steps in a method of generating high harmonic radiation in accordance with an embodiment.

High harmonic radiation sources 600, 800 may be operated in methods for efficiently generating high harmonic radiation, as depicted in FIG. 10. In step 1010, the intensity and/or phase distribution of the pre-pulse 612*a*, 872 may be shaped with a beam shaping device 620, 820 in a customised manner. In step 1020, a target delay time between the main pulse 612*b*, 812 and the pre-pulse 612*a*, 872 may be set. In step 1030, once the delay time is set, the pre-pulse 612*a*, 872 may be used to condition a gas target 650, 850, 950 which may be contained in a vessel 690, 890, 990. Such conditioning of the gas target by the pre-pulse 612*a*, 872 may be configured to occur prior to the arrival of the main pulse 612*b*, 812. The gas target 650, 850, 950 may comprise a gas medium suitable for high harmonic generation (HHG). The pre-pulse 612*a*, 872 may define a customised plasma distribution in the gas target 650, 850, 950 which compensates the main pulse 612*b*, 812 induced plasma distribution. In step 1040, after the gas target 650, 850, 950 is conditioned by the pre-pulse 612*a*, 872, the main pulse is fired onto the gas target 650, 850, 950 for generating high harmonic radiation. At least some of the high harmonic radiation obtained through the HHG process may exit the vessel 690, 890, 990 through an optical filter 660, 860, 960. More details on methods of generating high harmonic radiation are provided in the description of the assemblies described in relation to FIGS. 6 to 9 above.

The high harmonic radiation source 600, 800 may be provided in for example a metrology apparatus MT, an inspection apparatus, a lithographic apparatus LA, and/or a lithographic cell LC. Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Further embodiments are disclosed in the subsequent list of numbered clauses:

1. A high harmonic radiation source comprising a gas medium and being configured to: condition a gas medium by irradiating the gas medium with a pre-pulse of radiation, thereby generating a plasma comprising a pre-pulse plasma distribution;

irradiate the gas medium with a main pulse of radiation to generate said high harmonic radiation, wherein said conditioning step is such that the plasma comprising a pre-pulse plasma distribution acts to configure a wavefront of said main pulse to improve one or both of: the efficiency of the high harmonic generation process and the beam quality of the high harmonic radiation.

2. A high harmonic radiation source as defined in clause 1, wherein said high harmonic radiation source further comprises a beam shaping device configured to shape said pre-pulse prior to said conditioning such that said pre-pulse comprises a customized pre-pulse of radiation.

3. An apparatus as defined in clause 2, wherein said beam shaping device comprises a phase modulation device and/or an intensity modulation device.

4. An apparatus as defined in clause 2 or 3, wherein said beam shaping device comprises one or any combination of: a phase plate, a spatial light modulator or an aperture.

5. A high harmonic radiation source as defined in any of clauses 2, 3 or 4, wherein said beam shaping device is operable to shape said customized pre-pulse such that it generates said pre-pulse plasma distribution which compensates for a main-pulse plasma distribution subsequently generated by said main pulse such that said main pulse experiences a more homogeneous plasma distribution in a post main-pulse plasma generated by the combination of the pre-pulse and main-pulse.

6. A high harmonic radiation source as defined in any of clauses 2 to 5, wherein said beam shaping device is operable to shape said customized pre-pulse to have an off-axis spatial intensity distribution configured to generate an off-axis pre-pulse plasma distribution.

7. A high harmonic radiation source as defined in any of clauses 2 to 6, wherein said beam shaping device is operable to shape said customized pre-pulse such that said pre-pulse plasma distribution has a lower plasma density in an axial region with respect to the plasma density at a region outside of said axial region.

8. A high harmonic radiation source as defined in any of clauses 2 to 7, wherein said customized pre-pulse is configured to shape said customized pre-pulse to comprise a substantially annular spatial distribution, and therefore generate said pre-pulse plasma distribution with a substantially annular spatial distribution.

9. A high harmonic radiation source as defined in any of clauses 2 to 8, wherein said beam shaping device is operable to shape said customized pre-pulse to minimize a plasma defocusing effect resultant from said main-pulse plasma distribution.

10. A high harmonic radiation source as defined in any of clauses 2 to 9, wherein said beam shaping device is operable to shape said customized pre-pulse to maximize a phase matching distance over which the phase of the main pulse and high harmonic radiation is substantially phase matched.

11. A high harmonic radiation source as defined in clause 10, configured such that said main pulse and said customized pre-pulse are each focused at respective different focal planes.

12. A high harmonic radiation source as defined in clause 10 or 11, wherein said pre-pulse plasma distribution is configured to correct said wavefront of said main pulse such that beam quality of said high harmonic radiation is improved.

13. A high harmonic radiation source as defined in any of clauses 2 to 10, configured such that said main pulse and said pre-pulse are each focused at a common focal plane.

14. A high harmonic radiation source as defined in any preceding clause, wherein said main pulse is configured to be temporally delayed with respect to said pre-pulse by a delay time.

15. A high harmonic radiation source as defined in clause 14, wherein said delay time is in the range of 1 fs and 1 ps and both of said main pulse and said pre-pulse are configured to comprise a pulse duration in the range of 1 fs and 1 ps.

16. A high harmonic radiation source as defined in clause 14 or 15, comprising an optical delay line to temporally delay said main pulse with respect to said pre-pulse.

17. A high harmonic radiation source as defined in any preceding clause, being operable to generate said pre-pulse as a circularly polarized pre-pulse.

18. A high harmonic radiation source as defined in any preceding clause, comprising a common drive laser for generating said main pulse and said pre-pulse.

19. A high harmonic radiation source as defined in any of clauses 1 to 17, wherein comprising a main pulse laser for generating the main pulse and a pre-pulse laser for generating said pre-pulse.

20. A high harmonic radiation source as defined in clause 19, wherein said pre-pulse laser comprises a passively mode-locked solid-state laser.

21. A high harmonic radiation source as defined in clauses 19 or 20, wherein said main pulse laser and said pre-pulse laser are configured to emit respective temporally synchronized pulse trains using a timing synchronization system.

22. A high harmonic radiation source as defined in clauses 19, 20 or 21 wherein said main pulse laser and said pre-pulse laser are configured to generate radiation at different wavelengths; and said pre-pulse laser is further configured to generate a further pulse overlapping said main pulse.

23. A high harmonic radiation source as defined in clause 22 wherein said further pulse is at a second harmonic frequency with respect to said main pulse.

24. A high harmonic radiation source as defined in any preceding clause, wherein said main pulse and said pre-pulse each comprise a wavelength in the range of 200 nm to 2500 nm.

25. A high harmonic radiation source as defined in any preceding clause, wherein repetition of said main pulse and said pre-pulse both comprise a repetition rate in the range of 1 Hz to 10 MHz.
26. A high harmonic radiation source as defined in any preceding clause, wherein said high harmonic radiation comprises wavelengths in the range of 1 nm to 100 nm.
27. A metrology device comprising a high harmonic radiation source as defined in any preceding clause.
28. A metrology device as defined in defined 27, comprising a scatterometer metrology apparatus, a level sensor or an alignment sensor.
29. A method of generating high harmonic radiation in a high harmonic generation process, comprising:
generating a pre-pulse of radiation;
conditioning a gas medium with said pre-pulse to generate a plasma comprising a pre-pulse plasma distribution;
irradiating the gas medium with a main pulse of radiation to generate said high harmonic radiation, wherein said pre-pulse plasma distribution is configured to configure a wavefront of said main pulse so as to improve one or both of: the efficiency of the high harmonic generation process and the beam quality of the high harmonic radiation.
30. A method as defined in clause 29, further comprising shaping a phase and/or an intensity of said pre-pulse prior to said conditioning such that said pre-pulse comprises a customized pre-pulse of radiation.
31. A method as defined in clause 30, wherein said pre-pulse plasma distribution compensates for a main-pulse plasma distribution subsequently generated by said main pulse such that said main pulse experiences a more homogeneous plasma distribution in a post main-pulse plasma generated by the combination of the pre-pulse and main-pulse.
32. A method as defined in clause 30 or 31, wherein said customized pre-pulse has an off-axis spatial intensity distribution which generates an off-axis pre-pulse plasma distribution.
33. A method as defined in clause 30, 31 or 32, wherein said pre-pulse plasma distribution has a lower plasma density in an axial region with respect to the plasma density at a region outside of said axial region.
34. A method as defined in clause any of clauses 30 to 33, comprising generating said customized pre-pulse with a substantially annular spatial distribution such that said pre-pulse plasma distribution has a substantially annular spatial distribution.
35. A method as defined in any of clauses 31 to 34, wherein said pre-pulse is shaped to minimize a plasma defocusing effect resultant from said main-pulse plasma distribution.
36. A method as defined in any of clauses 30 to 35, wherein said pre-pulse is shaped to maximize a phase matching distance over which the phase of the main pulse and high harmonic radiation is substantially phase matched.
37. A method as defined in clause 36, wherein said main pulse and said customized pre-pulse are each focused at respective different focal planes.
38. A method as defined in clause 36 or 37, wherein said pre-pulse plasma distribution corrects said wavefront of said main pulse such that beam quality of said high harmonic radiation is improved.
39. A method as defined in any of clauses 30 to 36, wherein the main pulse and said customized pre-pulse are each focused at a common focal plane.
40. A method as defined in any of clauses 29 to 39, wherein said main pulse is temporally delayed with respect to said pre-pulse by a delay time.
41. A method as defined in clause 40, wherein said delay time is in the range of 1 fs and 1 ps and both of said main pulse and said pre-pulse are configured to comprise a pulse duration in the range of 1 fs and 1 ps.
42. A method as defined in any of clauses 29 to 41, wherein said high harmonic radiation comprises wavelengths in the range of 1 nm to 100 nm.
43. A method as defined in any of clauses 29 to 42, wherein said pre-pulse is generated as a circularly polarized pre-pulse.
44. A method as defined in any of clauses 29 to 43, wherein said main pulse and said pre-pulse are generated with different wavelengths; and the method further comprises: generating a further pulse overlapping said main pulse.
45. A method as defined in clause 44 wherein said further pulse is at a second harmonic frequency with respect to said main pulse Although specific reference may be made in this text to embodiments in the context of a lithographic apparatus, embodiments may be used in other apparatus. Embodiments may form part of a mask inspection apparatus, a metrology apparatus, or any apparatus that measures or processes an object such as a wafer (or other substrate) or mask (or other patterning device). These apparatuses may be generally referred to as lithographic tools. Such a lithographic tool may use vacuum conditions or ambient (non-vacuum) conditions.

Although specific reference may be made in this text to embodiments in the context of an inspection or metrology apparatus, embodiments may be used in other apparatus. Embodiments may form part of a mask inspection apparatus, a lithographic apparatus, or any apparatus that measures or processes an object such as a wafer (or other substrate) or mask (or other patterning device). The term "metrology apparatus" (or "inspection apparatus") may also refer to an inspection apparatus or an inspection system (or a metrology apparatus or a metrology system). E.g. the inspection apparatus that comprises an embodiment may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch of the metrology targets may be close to the resolution limit of the optical system of the scatterometer or may be smaller, but may be much larger than the dimension of typical non-target structures optionally product structures made by lithographic process in the target portions C. In practice the lines and/or spaces of the overlay gratings within the target structures may be made to include smaller structures similar in dimension to the non-target structures.

While specific embodiments have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer. Although specific reference is made to SXR and EUV electromagnetic radiations, it will be appreciated that the invention, where the context allows, may be practiced with all electromagnetic radiations, includes radio waves, microwaves, infrared, (visible) light, ultraviolet, X-rays, and gamma rays. As an alternative to optical metrology methods, it has also been considered to use X-rays, optionally hard X-rays, for example radiation in a wavelength range between 0.01 nm and 10 nm, or optionally between 0.01 nm and 0.2 nm, or optionally between 0.1 nm and 0.2 nm, for metrology measurements.

The invention claimed is:

1. A high harmonic radiation source comprising a gas medium and being configured to:
   irradiate the gas medium with a main pulse of radiation to generate high harmonic radiation; and
   irradiate the gas medium with a pre-pulse of radiation prior to an arrival of the main pulse of radiation,
   wherein the pre-pulse of radiation is used to condition the gas medium.

2. The high harmonic radiation source of claim 1, wherein the conditioning step is such that the pre-pulse is used to condition the gas medium by deliberately pre-ionizing a certain part of the gas medium.

3. The high harmonic radiation source of claim 1, wherein the conditioning step is such that a plasma comprising a pre-pulse plasma distribution is generated.

4. The high harmonic radiation source of claim 3, wherein the conditioning step is such that the plasma comprising the pre-pulse plasma distribution acts to configure a wavefront of the main pulse.

5. The high harmonic radiation source of claim 4, wherein the pre-pulse plasma distribution is configured to correct the wavefront of the main pulse such that beam quality of the high harmonic radiation is improved.

6. The high harmonic radiation source of claim 1, wherein the high harmonic radiation source further comprises a beam shaping device configured to shape the pre-pulse to a customized pre-pulse prior to the conditioning step.

7. The apparatus of claim 6, wherein the beam shaping device comprises a phase modulation device and/or an intensity modulation device.

8. The apparatus of claim 6, wherein the beam shaping device comprises one or any combination of a phase plate, a spatial light modulator, or an aperture.

9. The high harmonic radiation source of claim 6, wherein the beam shaping device is operable to shape the customized pre-pulse such that it generates the pre-pulse plasma distribution that compensates for a main pulse plasma distribution subsequently generated by the main pulse.

10. The high harmonic radiation source of claim 6, wherein the beam shaping device is operable to shape the customized pre-pulse to have an off-axis spatial intensity distribution configured to generate an off-axis pre-pulse plasma distribution.

11. The high harmonic radiation source of claim 1, wherein the main pulse is configured to be temporally delayed with respect to the pre-pulse by a delay time.

12. The high harmonic radiation source of claim 1, wherein the high harmonic radiation source is operable to generate the pre-pulse as a circularly polarized pre-pulse.

13. The high harmonic radiation source of claim 1, comprising a main pulse laser for generating the main pulse and a pre-pulse laser for generating the pre-pulse.

14. A metrology device comprising a high harmonic radiation source comprising a gas medium and being configured to:
   irradiate the gas medium with a main pulse of radiation to generate high harmonic radiation; and
   irradiate the gas medium with a pre-pulse of radiation prior to an arrival of the main pulse of radiation,
   wherein the pre-pulse of radiation is used to condition the gas medium.

15. A method of generating high harmonic radiation in a high harmonic generation process, comprising:
   receiving a pre-pulse of radiation;
   irradiating a gas medium with the pre-pulse prior to an arrival of a main pulse of radiation; and
   irradiating the gas medium with the main pulse of radiation to generate the high harmonic radiation,
   wherein the pre-pulse of radiation is used to condition the gas medium.

* * * * *